(12) United States Patent
Punzalan et al.

(10) Patent No.: US 8,062,934 B2
(45) Date of Patent: Nov. 22, 2011

(54) INTEGRATED CIRCUIT PACKAGE SYSTEM WITH GROUND BONDS

(75) Inventors: Jeffrey D. Punzalan, Singapore (SG); Henry Descalzo Bathan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 937 days.

(21) Appl. No.: 11/766,785

(22) Filed: Jun. 21, 2007

(65) Prior Publication Data

US 2008/0006929 A1   Jan. 10, 2008

Related U.S. Application Data

(60) Provisional application No. 60/805,467, filed on Jun. 22, 2006.

(51) Int. Cl.
*H01L 21/00* (2006.01)

(52) U.S. Cl. ........ 438/123; 257/692; 257/690; 257/666; 257/670; 257/E23.037

(58) Field of Classification Search .............. 257/692, 257/690, 666, 670 E23.037; 438/123
See application file for complete search history.

(56) References Cited

U.S. PATENT DOCUMENTS

| | | | |
|---|---|---|---|
| 5,475,606 A | 12/1995 | Muyshondt et al. | |
| 5,532,905 A * | 7/1996 | Moore | 361/723 |
| 6,515,861 B1 | 2/2003 | Andric et al. | |
| 6,661,083 B2 | 12/2003 | Lee et al. | |
| 6,717,824 B2 | 4/2004 | Miyajima et al. | |
| 6,833,609 B1 | 12/2004 | Fusaro et al. | |
| 6,838,751 B2 | 1/2005 | Cheng et al. | |
| 6,867,071 B1 | 3/2005 | Lee et al. | |
| 6,867,072 B1 | 3/2005 | Shiu et al. | |
| 6,876,068 B1 | 4/2005 | Lee et al. | |
| 6,876,069 B2 | 4/2005 | Punzalan et al. | |
| 6,882,037 B2 | 4/2005 | Lin et al. | |
| 6,903,448 B1 | 6/2005 | Sutardja et al. | |
| 6,917,097 B2 | 7/2005 | Chow et al. | |
| 6,965,157 B1 | 11/2005 | Perez et al. | |
| 6,995,459 B2 * | 2/2006 | Lee et al. | 257/676 |
| 7,045,396 B2 * | 5/2006 | Crowley et al. | 438/123 |
| 7,211,887 B2 | 5/2007 | Channabasappa et al. | |
| 2003/0127711 A1 | 7/2003 | Kawai et al. | |
| 2004/0238921 A1 | 12/2004 | Lee et al. | |
| 2005/0236701 A1 | 10/2005 | Minamio et al. | |
| 2006/0006510 A1 | 1/2006 | Koduri | |
| 2006/0033184 A1 | 2/2006 | Park et al. | |
| 2007/0114650 A1 | 5/2007 | Punzalan et al. | |

* cited by examiner

*Primary Examiner* — Junghwa M Im
(74) *Attorney, Agent, or Firm* — Mikio Ishimaru

(57) ABSTRACT

An integrated circuit package system comprising: forming leads adjacent a die paddle having a die pad extension; forming a region having one of the leads depopulated for the die pad extension; and connecting an integrated circuit die to the die pad extension.

20 Claims, 11 Drawing Sheets

INTEGRATED CIRCUIT PACKAGE SYSTEM WITH GROUND BONDS

CROSS-REFERENCE TO RELATED APPLICATION

This application claims the benefit of U.S. Provisional Patent Application Ser. No. 60/805,467 filed Jun. 22, 2006.

The present application contains subject matter related to co-pending U.S. patent application Ser. No. 11/164,335. The related application is assigned to STATS ChipPAC Ltd.

TECHNICAL FIELD

The present invention relates generally to integrated circuit package systems, and more particularly to a system for integrated circuit packages with ground bonds.

BACKGROUND ART

Most if not all electronic products benefit from increasing including functions and performance in integrated circuit chips particularly in a smaller (or at least not larger) overall physical size or form factor. These needs for more, faster, and smaller are often very visible with the many consumer electronic products including but not limited to personal portable devices such as cellular phones, digital cameras, and music players.

The demands for smaller yet higher performing semiconductor devices have motivated the development of new techniques for producing smaller and less expensive semiconductor devices. One of these technologies involves packaging the integrated circuit chip in as small a form factor as possible in addition to manufacturing the integrated circuit chip as efficiently as possible.

Usually, many individual devices are constructed on a semiconductor wafer. When the devices are separated into individual rectangular units, each takes the form of an integrated circuit chip. In order to interface a chip with other circuitry, it is common to mount it with leads and individually connect pads on the chip to the leads of a package using extremely fine wires or similar electrical connectors. The assemblies are then packaged by individually encapsulating them in molded plastic or ceramic bodies.

Integrated circuit packaging technology has shown an increase in the number of chips mounted on a single circuit board or substrate that parallels the reduction in the number of components needed for a circuit. This results in packaging designs that are more compact, in the physical size and shape of a device, and provide a significant increase in overall integrated circuit density. However, integrated circuit density continues to be limited by the area available for mounting chips on a substrate.

To condense the packaging of individual devices, packages have been developed in which the integrated circuit package is not much larger than the integrated circuit(s) within. Each package site is a structure that provides mechanical support for the individual integrated circuit device(s). The package also provides one or more layers of interconnect lines that enable the devices to be connected electrically to surrounding circuitry.

In some cases, multi-chip devices can be fabricated faster and more cheaply than a corresponding single integrated circuit chip, that incorporates all the same functions. Some multi-chip modules have been found to increase circuit density and miniaturization, improve signal propagation speed, reduce overall device size, improve performance, and lower costs.

However, such multi-chip modules can be bulky. Package density is determined by the area required to mount a chip or module on a circuit board. One method for reducing the board size of multi-chip modules and thereby increase their effective density is to stack the chips vertically within the module or package. Such designs are improvements over prior packages that combined several chips and associated passive components side by side in a single, horizontal layer.

In any case, electrical connections and the leads can be very closely spaced even with a single integrated circuit chip. The close spacing of the electrical connections results in several problems in manufacturing as well as assembly of the integrated circuit package and the circuit board. One such problem involves a lack of space to supply a ground level voltage to the integrated circuit chip(s). This is particularly critical as the integrated circuit chip(s) cannot operate without a ground level voltage supply.

Despite the advantages of recent developments in semiconductor fabrication and packaging techniques, there is a continuing need for improving integrated circuit package form factors, numbers of integrated circuit package signal connections, and integrated circuit connections to a ground level supply.

Thus, a need still remains for an integrated circuit package system to provide improved compactness, functions, efficiency, and performance. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system comprising: forming leads adjacent a die paddle having a die pad extension; forming a region having one of the leads depopulated for the die pad extension; and connecting an integrated circuit die to the die pad extension.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
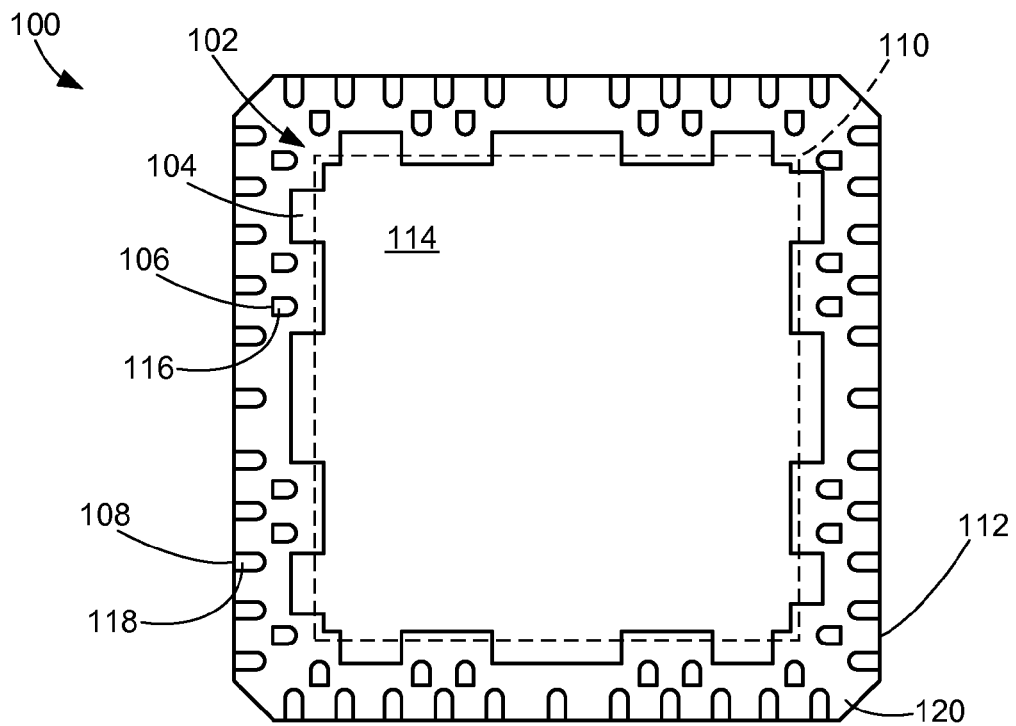
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a bottom view of an integrated circuit package system 100 in a first embodiment of the present invention. The integrated circuit package system 100 preferably includes a die paddle 102 having die pad extensions 104. The integrated circuit package system 100 can also include inner leads 106 and outer leads 108.

The inner leads 106 and the outer leads 108 provide electrical connectivity for signals of an integrated circuit die 110, represented by hidden lines, as it is obscured in this view by the die paddle 102 and an encapsulant 112. The encapsulant 112 can provide structural integrity to the die paddle 102, the inner leads 106, the outer leads 108, and the integrated circuit die 110.

The die pad extensions 104 can be formed on a perimeter of the die paddle 102 to extend a portion of an outer edge of the die paddle. The die pad extensions 104 can optionally be formed in a shape of a rectangle having edges smaller than a planar dimension of the die paddle. Spacing is preferably provided between one of the die pad extensions 104 and another of the die pad extensions.

The die pad extensions 104 of the die paddle 102 can be formed in a region having a portion of the inner leads 106 depopulated. Depopulating the portion of the inner leads 106 can preferably include one or more of the inner leads 106 adjacent sides of the die pad extensions 104. At least one region is formed in a row of the inner leads 106 facing a side of the die paddle 102 by depopulating the portion of the inner leads 106 between another two of the leads in the row. The another two of the inner leads 106 in the row of the inner leads 106 are on opposite sides of at least one of the die pad extension 104 and the at least one region in the row of the inner leads 106 facing the side of the die paddle 102. The die pad extensions 104 are preferably formed having one or more of the inner leads 106 between the die pad extensions 104 and adjacent locations of the die pad extensions 104.

A die pad lower surface 114 can also be optionally exposed on a side opposite the integrated circuit die 110. An inner lead lower surface 116 and an outer lead lower surface 118 can further be exposed on a side opposite the integrated circuit die 110 to provide electrical connectivity to a next level system such as another package or a printed circuit board (PCB).

The inner lead lower surface 116 and the outer lead lower surface 118 can form a planar surface for interconnection. The planar surface can optionally be coplanar to an encapsulant bottom surface 120. The encapsulant bottom surface 120 can provide substantially exposed the inner lead lower surface 116, the outer lead lower surface 118, and optionally the die pad lower surface 114.

For illustrative purposes, the integrated circuit package system 100 is shown as quad flat nolead package having characteristics of saw singulation although it is understood that any package type or singulation method may be used.

It has been discovered that the integrated circuit package system 100 with the die paddle 102 having the die pad extensions 104 provides ground bond locations, high I/O counts, and a small footprint particularly with large die.

Figure 2:
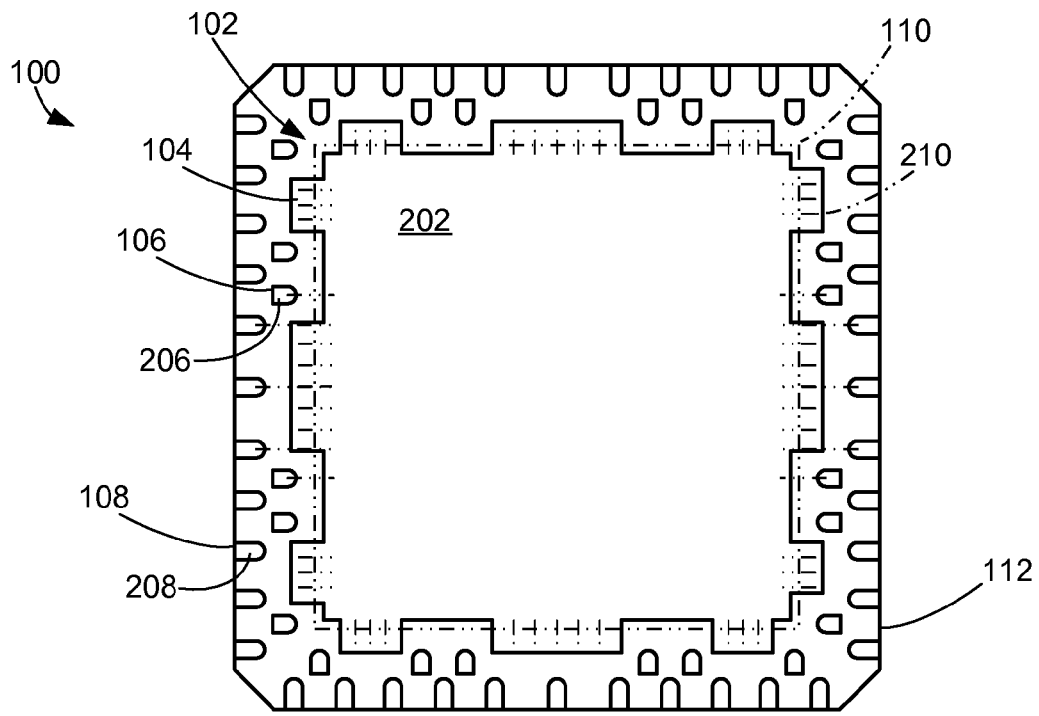
FIG. 2 is a top view of the integrated circuit package system with encapsulation partially removed.

Referring now to FIG. 2 therein is shown a top view of the integrated circuit package system 100 with encapsulation partially removed. The portion of the encapsulant 112 has been removed for clarity. The integrated circuit package system 100 includes the die paddle 102 having the die pad extensions 104, the inner leads 106, and the outer leads 108.

The die paddle 102, shown with hidden lines, can include a die pad upper surface 202, also partially shown with hidden lines, as they are partially obscured in this view by the integrated circuit die 110. The integrated circuit die 110 can be mounted over the die pad upper surface 202 that can also provide a connection surface for a ground level signal.

The integrated circuit die 110 can also be connected to the inner leads 106, and the outer leads 108 for logic signals. The inner leads 106 can include an inner lead upper surface 206 and similarly, the outer leads 108 can include an outer lead upper surface 208. The inner lead upper surface 206 and the outer lead upper surface 208 can provide a connection surface for the logical signals.

Connectors 210 such as bond wires can connect the integrated circuit die 110 and the die pad extensions 104. The connectors 210 connected to the die pad extensions 104 can preferably provide the ground level signal to the integrated circuit die 110. The connectors 210 can also electrically connect the logic signals to the integrated circuit die 110, the inner lead upper surface 206, or the outer lead upper surface 208.

Figure 3:
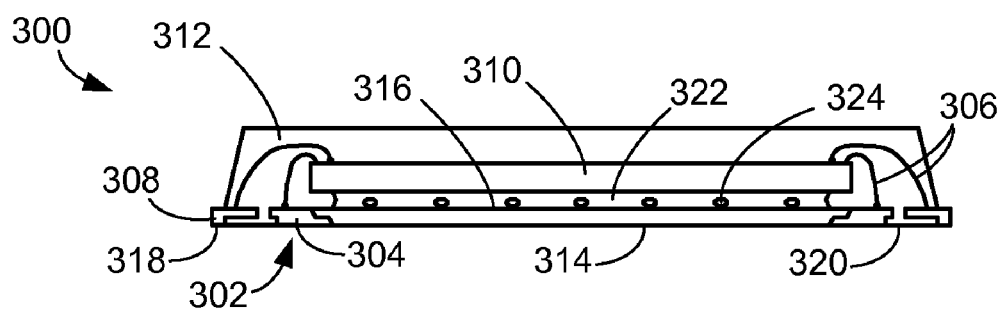
FIG. 3 is a cross-sectional view of an integrated circuit package system taken along lines 3-3 of FIG. 4 in a second embodiment of the present invention.
Figure 4:
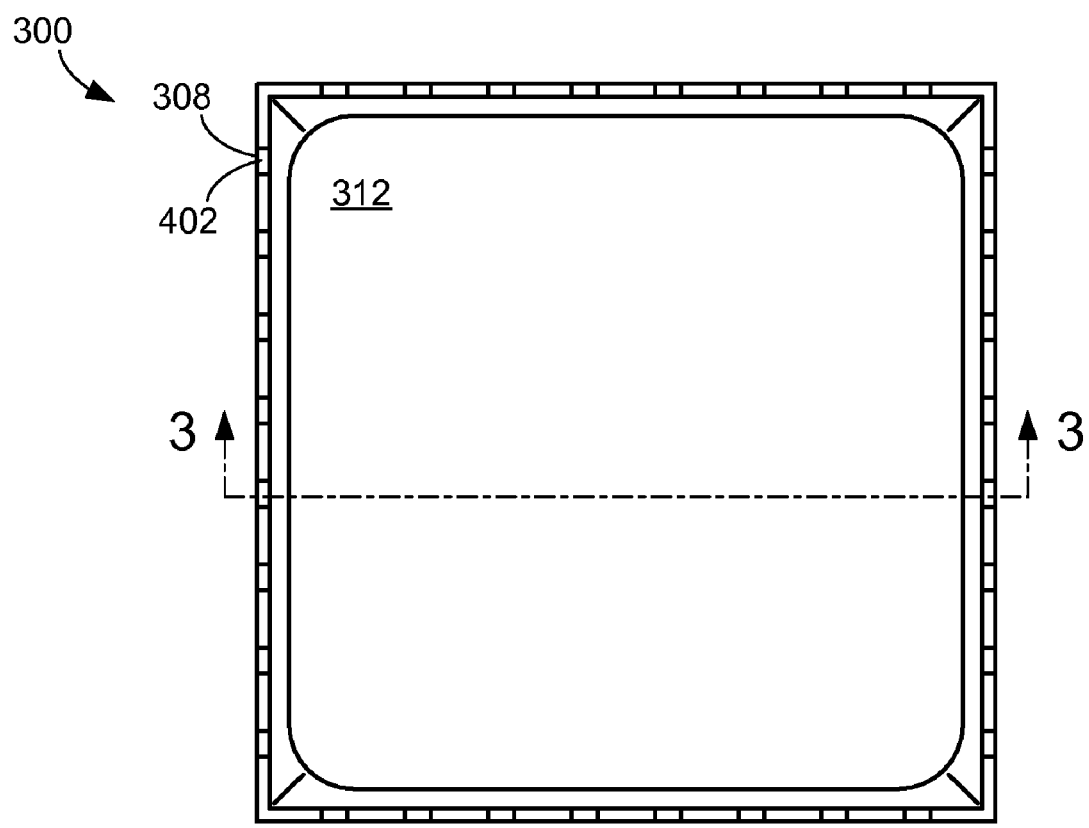
FIG. 4 is a top view of the integrated circuit package system.

Referring now to FIG. 3, therein is shown a cross-sectional view of an integrated circuit package system 300 taken along lines 3-3 of FIG. 4 in a second embodiment of the present invention. The integrated circuit package system 300 is similar to the integrated circuit package system 100 of FIG. 1 except for having the characteristics of punch singulation. The integrated circuit package system 300 preferably includes a die paddle 302 having die pad extensions 304.

The integrated circuit package system 300 can also include connectors 306 such as bond wires inner leads (not shown) and outer leads 308. The inner leads and the outer leads 308 provide electrical connectivity for signals of an integrated circuit die 310. An encapsulant 312 can provide structural integrity and protection to the die paddle 302, the inner leads, the outer leads 308, the connectors 306, and the integrated circuit die 310.

The connectors 306 such as bond wires can connect the integrated circuit die 310 and the die pad extensions 304. The connectors 306 connected to the die pad extensions 304 can preferably provide a ground level signal to the integrated circuit die 310. The connectors 306 can also electrically connect logic signals to the integrated circuit die 310, the inner leads, or the outer leads 308.

The die pad extensions 304 can be formed on a perimeter of the die paddle 302 to extend a portion of an outer edge of the die paddle. The die pad extensions 304 can optionally be formed in a shape of a rectangle having edges smaller than a planar dimension of the die paddle. Spacing is preferably provided between one of the die pad extensions 304 and another of the die pad extensions.

The die pad extensions 304 of the die paddle 302 can be formed in a region having a portion of the inner leads depopulated. Depopulating the portion of the inner leads can preferably include one or more of the inner leads adjacent sides of the die pad extensions 304. The die pad extensions 304 are preferably formed having one or more of the inner leads between the die pad extensions 304 and adjacent locations of the die pad extensions 304.

The die paddle 302 also includes a die pad lower surface 314 and a die pad upper surface 316. The die pad lower surface 314 can also be optionally exposed on a side opposite the integrated circuit die 310. An inner lead lower surface and an outer lead lower surface 318 can further be exposed on a side opposite the integrated circuit die 310 to provide electrical connectivity to a next level system such as another package or a printed circuit board (PCB).

The inner lead lower surface and the outer lead lower surface 318 can form a planar surface for interconnection. The planar surface can optionally be coplanar to an encapsulant bottom surface 320. The encapsulant bottom surface 320 can provide substantially exposed the inner lead lower surface, the outer lead lower surface 318, and optionally the die pad lower surface 314.

The integrated circuit die 310 can be mounted over the die pad upper surface 316 with a die attach layer 322 optionally having a spacer 324. The die pad upper surface 316 can provide a mounting surface for the integrated circuit die 310 on a side opposite the planar surface for interconnection. The die attach layer 322 and the spacer 324 can provide attachment and spacing of the integrated circuit die 310 and the mounting surface of the die pad upper surface 316.

For illustrative purposes, the integrated circuit package system 300 is shown as quad flat nolead package having characteristics of punch singulation although it is understood that any package type or singulation method may be used.

Referring now to FIG. 4, therein is shown a top view of the integrated circuit package system 300. The integrated circuit package system 300 includes the outer leads 308 and the encapsulant 312. The outer leads 308 provide electrical connectivity for signals of the integrated circuit die 310 of FIG. 3. The encapsulant 312 can provide protection and structural integrity to the die paddle 302 of FIG. 3, the inner leads, the outer leads 308 of FIG. 3, the connectors 306 of FIG. 3, and the integrated circuit die 310 of FIG. 3.

The integrated circuit package system 300 includes the die paddle 302 of FIG. 3 having the die pad extensions 304 of FIG. 3, the inner leads, and the outer leads 308. The integrated circuit die 310 can be mounted over the die paddle 302 that can also provide a connection surface for the ground level signal.

The integrated circuit die 310 can also be connected to the inner leads and the outer leads 308 for logic signals. The outer leads 308 can include an outer lead upper surface 402. The inner lead and the outer lead upper surface 402 can provide a connection surface for the connectors 306 and thereby the logical signals or the ground level signal.

The connectors 306 such as bond wires can connect the integrated circuit die 310 and the die pad extensions 304. The connectors 306 connected to the die pad extensions 304 can preferably provide the ground level signal to the integrated circuit die 310. The connectors 306 can also electrically connect the logic signals to the integrated circuit die 310, the inner leads, or the outer lead upper surface 402.

Figure 5:
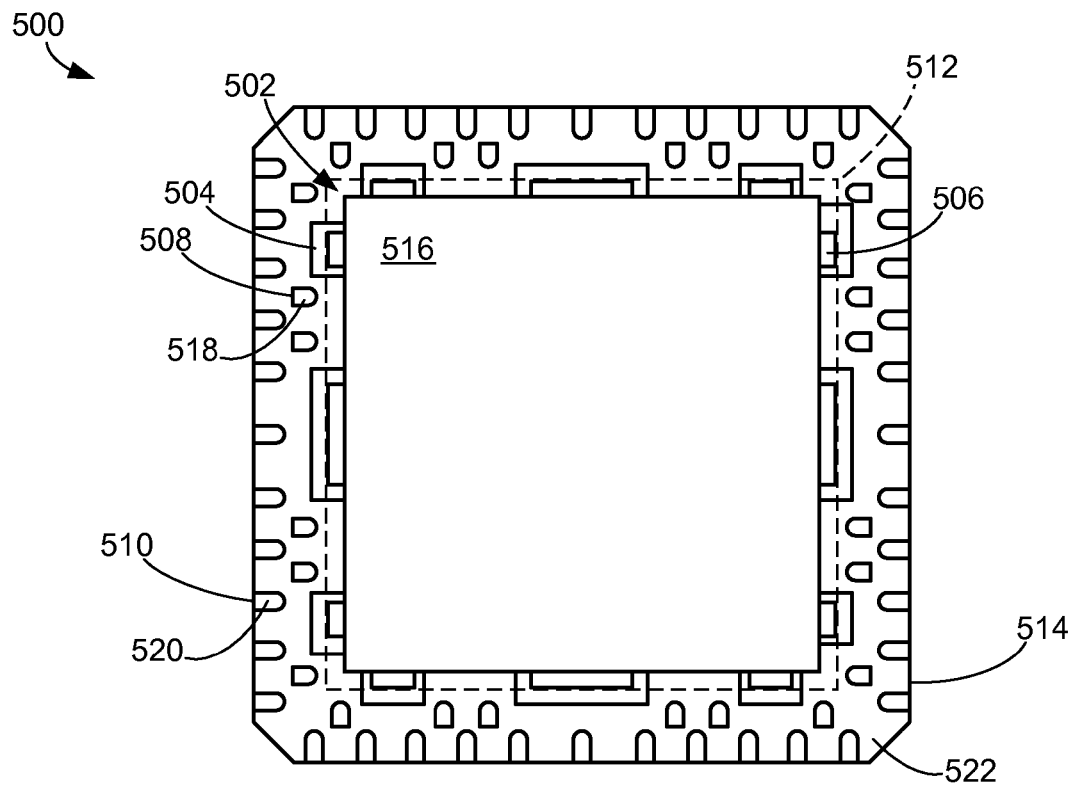
FIG. 5 is a bottom view of an integrated circuit package system in a third embodiment of the present invention.

Referring now to FIG. 5, therein is shown a bottom view of an integrated circuit package system 500 in a third embodiment of the present invention. The integrated circuit package system 500 preferably includes a die paddle 502 having die pad extensions 504. The die pad extensions 504 include a die pad cavity 506 such as a slot to enhance locking. The integrated circuit package system 500 can also include inner leads 508 and outer leads 510.

The inner leads 508 and the outer leads 510 provide electrical connectivity for signals of an integrated circuit die 512, represented by hidden lines, as it is obscured in this view by the die paddle 502 and an encapsulant 514. The encapsulant 514 can provide structural integrity to the die paddle 502, the inner leads 508, the outer leads 510, and the integrated circuit die 512. The die pad cavity 506 can improve the structural integrity and positioning of the encapsulant 514.

The die pad extensions 504 can be formed on a perimeter of the die paddle 502 to extend a portion of an outer edge of the die paddle. The die pad extensions 504 can optionally be formed in a shape of a rectangle having edges smaller than a planar dimension of the die paddle. Spacing is preferably provided between one of the die pad extensions 504 and another of the die pad extensions.

The die pad extensions 504 of the die paddle 502 can be formed in a region having a portion of the inner leads 508 depopulated. Depopulating the portion of the inner leads 508 can preferably include one or more of the inner leads 508 adjacent sides of the die pad extensions 504. The die pad extensions 504 are preferably formed having one or more of the inner leads 508 between the die pad extensions 504 and adjacent locations of the die pad extensions 504.

A die pad lower surface 516 can also be optionally exposed on a side opposite the integrated circuit die 512. An inner lead lower surface 518 and an outer lead lower surface 520 can further be exposed on a side opposite the integrated circuit die 512 to provide electrical connectivity to a next level system such as another package or a printed circuit board (PCB).

The inner lead lower surface 518 and the outer lead lower surface 520 can form a planar surface for interconnection. The planar surface can optionally be coplanar to an encapsulant bottom surface 522. The encapsulant bottom surface 522 can provide substantially exposed the inner lead lower surface 518, the outer lead lower surface 520, and optionally the die pad lower surface 516.

For illustrative purposes, the integrated circuit package system 500 is shown as quad flat nolead package having characteristics of saw singulation although it is understood that any package type or singulation method may be used.

Figure 6:
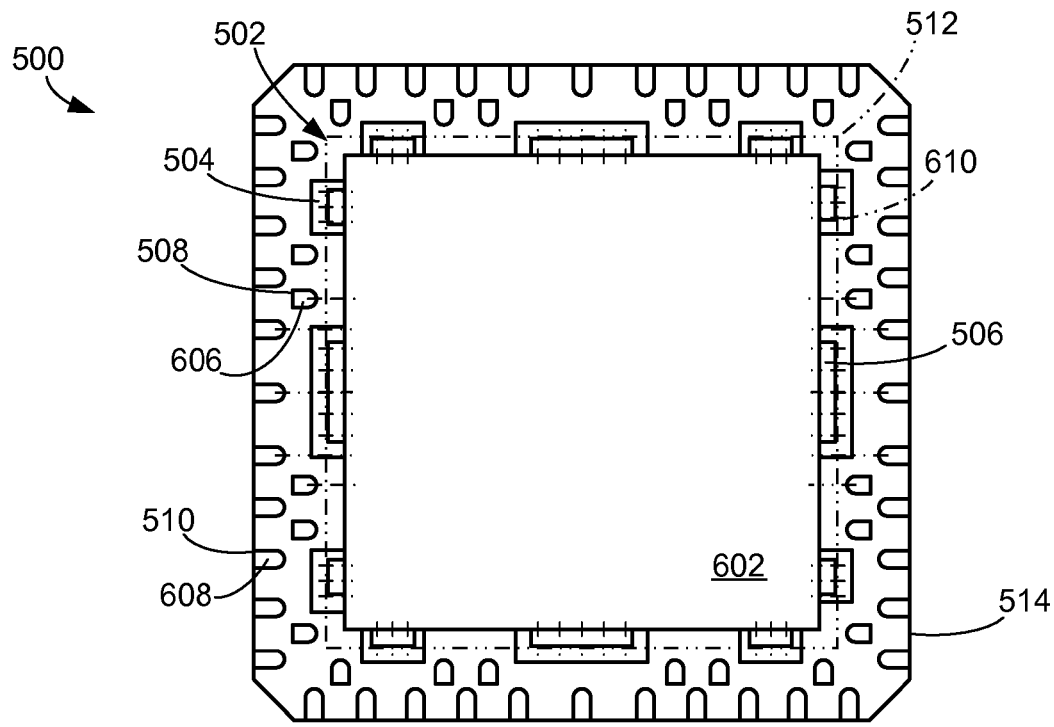
FIG. 6 is a top view of the integrated circuit package system with encapsulation partially removed.

Referring now to FIG. 6, therein is shown a top view of the integrated circuit package system 500 with encapsulation partially removed. The portion of the encapsulant 514 has been removed for clarity. The integrated circuit package system 500 includes the die paddle 502 having the die pad extensions 504, the die pad cavity 506, the inner leads 508, and the outer leads 510.

The die paddle 502 can include a die pad upper surface 602. The die pad cavity 506 can preferably extend to the die pad upper surface 602 and the die pad lower surface 516 of FIG. 5. The integrated circuit die 512 shown with phantom lines can be mounted over the die pad upper surface 602 and optionally the die pad cavity 506. The die pad upper surface 602 of the die pad extensions 504 can also provide a connection surface for a ground level signal.

The integrated circuit die 512 can also be connected to the inner leads 508, and the outer leads 510 for logic signals. The inner leads 508 can include an inner lead upper surface 606 and similarly, the outer leads 510 can include an outer lead upper surface 608. The inner lead upper surface 606 and the outer lead upper surface 608 can provide a connection surface for the logical signals.

Connectors 610 such as bond wires shown with phantom lines can connect the integrated circuit die 512 and the die pad extensions 504. The connectors 610 connected to the die pad extensions 504 can preferably provide the ground level signal to the integrated circuit die 512. The connectors 610 can also electrically connect the logic signals to the integrated circuit die 512, the inner lead upper surface 606, or the outer lead upper surface 608.

Figure 7:
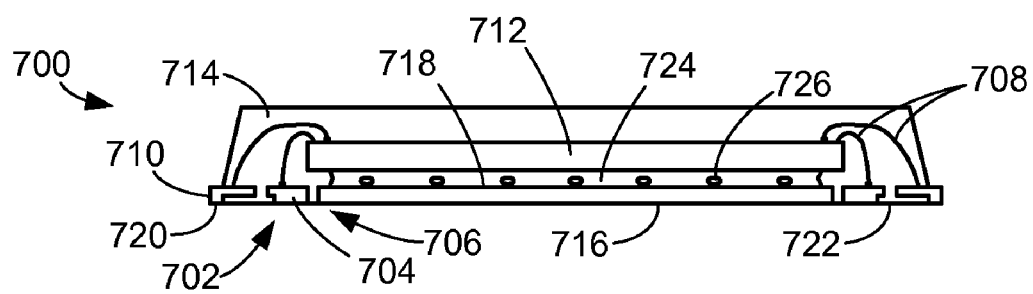
FIG. 7 is a cross-sectional view of an integrated circuit package system taken along lines 7-7 of FIG. 8 in a fourth embodiment of the present invention.
Figure 8:
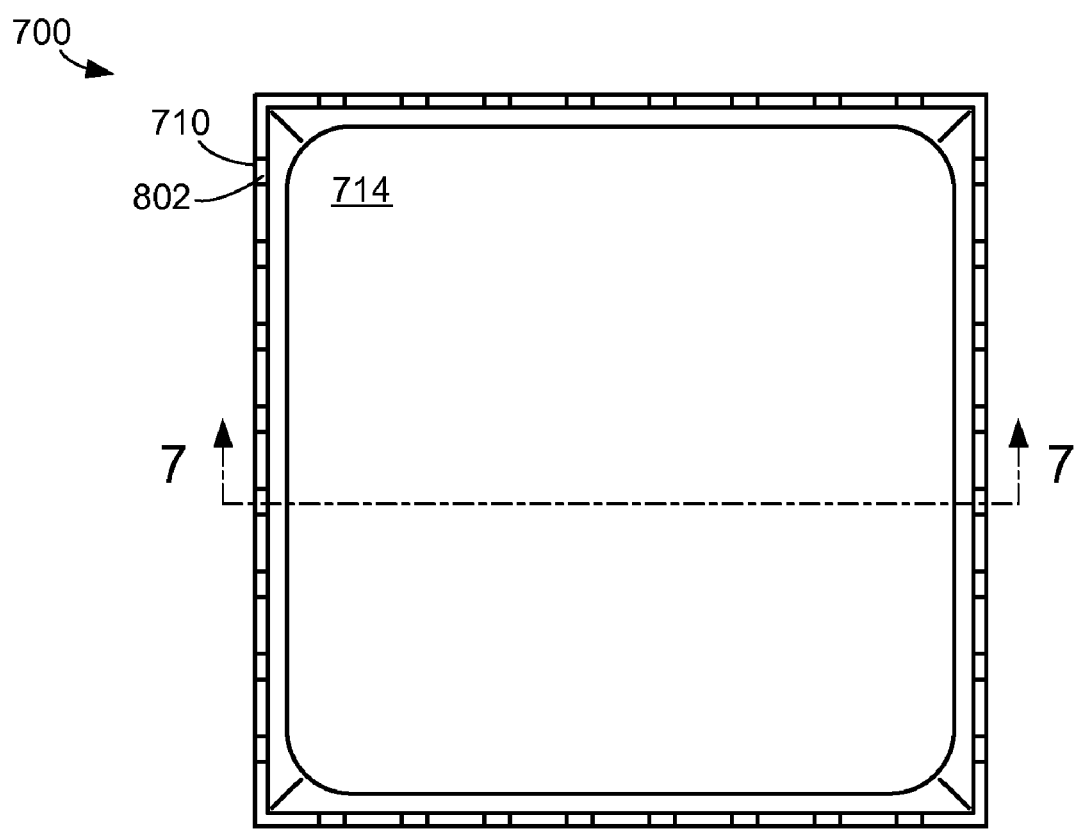
FIG. 8 is a top view of the integrated circuit package system.

Referring now to FIG. 7, therein is shown a cross-sectional view of an integrated circuit package system 700 taken along lines 8-8 of FIG. 8 in a fourth embodiment of the present invention. The integrated circuit package system 700 preferably includes a die paddle 702 having die pad extensions 704 and a die pad cavity 706 such as a slot to enhance locking.

The integrated circuit package system 700 can also include connectors 708 such as bond wires inner leads (not shown) and outer leads 710. Inner leads (not shown) and the outer leads 710 provide electrical connectivity for signals of an integrated circuit die 712. An encapsulant 714 can provide structural integrity and protection to the die paddle 702, the inner leads, the outer leads 710, the connectors 708, and the integrated circuit die 712. The die pad cavity 706 can improve the structural integrity and positioning of the encapsulant 714.

The connectors 708 such as bond wires can connect the integrated circuit die 712 and the die pad extensions 704. The connectors 708 connected to the die pad extensions 704 can preferably provide a ground level signal to the integrated circuit die 712. The connectors 708 can also electrically connect logic signals to the integrated circuit die 712, the inner leads, or the outer leads 710.

The die pad extensions 704 can be formed on a perimeter of the die paddle 702 to extend a portion of an outer edge of the die paddle. The die pad extensions 704 can optionally be formed in a shape of a rectangle having edges smaller than a planar dimension of the die paddle. Spacing is preferably provided between one of the die pad extensions 704 and another of the die pad extensions.

The die pad extensions 704 of the die paddle 702 can be formed in a region having a portion of the inner leads depopulated. Depopulating the portion of the inner leads can preferably include one or more of the inner leads adjacent sides of the die pad extensions 704. The die pad extensions 704 are preferably formed having one or more of the inner leads between the die pad extensions 704 and adjacent locations of the die pad extensions 704.

The die paddle 702 also includes a die pad lower surface 716 and a die pad upper surface 718. The die pad cavity 706 can preferably extend to the die pad lower surface 716 and the die pad upper surface 718. The die pad lower surface 716 can also be optionally exposed on a side opposite the integrated circuit die 712. An inner lead lower surface and an outer lead lower surface 720 can further be exposed on a side opposite the integrated circuit die 712 to provide electrical connectivity to a next level system such as another package or a printed circuit board (PCB).

The inner lead lower surface and the outer lead lower surface 720 can form a planar surface for interconnection. The planar surface can optionally be coplanar to an encapsulant bottom surface 722. The encapsulant bottom surface 722 can provide substantially exposed the inner lead lower surface, the outer lead lower surface 720, and optionally the die pad lower surface 716.

The integrated circuit die 712 can be mounted over the die pad upper surface 718 with a die attach layer 724 optionally having a spacer 726. The die pad upper surface 718 can provide a mounting surface for the integrated circuit die 712 on a side opposite the planar surface for interconnection. The die attach layer 724 and the spacer 726 can provide attachment and spacing of the integrated circuit die 712 and the mounting surface of the die pad upper surface 718.

For illustrative purposes, the integrated circuit package system 700 is shown as quad flat nolead package having characteristics of punch singulation although it is understood that any package type or singulation method may be used.

Referring now to FIG. 8, therein is shown a top view of the integrated circuit package system 700. The integrated circuit package system 700 includes the outer leads 710 and the encapsulant 714. The outer leads 710 provide electrical connectivity for signals of the integrated circuit die 712 of FIG. 7.

The encapsulant 714 can provide protection and structural integrity to the die paddle 702 of FIG. 7, the inner leads, the outer leads 710, the connectors 708 of FIG. 7, and the integrated circuit die 712. The die pad cavity 706 of FIG. 7 can improve the structural integrity and positioning of the encapsulant 714.

The integrated circuit package system 700 includes the die paddle 702 of FIG. 7 having the die pad extensions 704 of FIG. 7, the inner leads, and the outer leads 710. The integrated circuit die 712 can be mounted over the die paddle 702 that can also provide a connection surface for the ground level signal.

The integrated circuit die 712 can also be connected to the inner leads and the outer leads 710 for logic signals. The outer leads 710 can include an outer lead upper surface 802. The inner lead and the outer lead upper surface 802 can provide a connection surface for the connectors 708 and thereby the logical signals or the ground level signal.

The connectors 708 such as bond wires can connect the integrated circuit die 712 and the die pad extensions 704. The connectors 708 connected to the die pad extensions 704 can preferably provide the ground level signal to the integrated circuit die 712. The connectors 708 can also electrically connect the logic signals to the integrated circuit die 712, the inner leads, or the outer lead upper surface 802.

Figure 9:
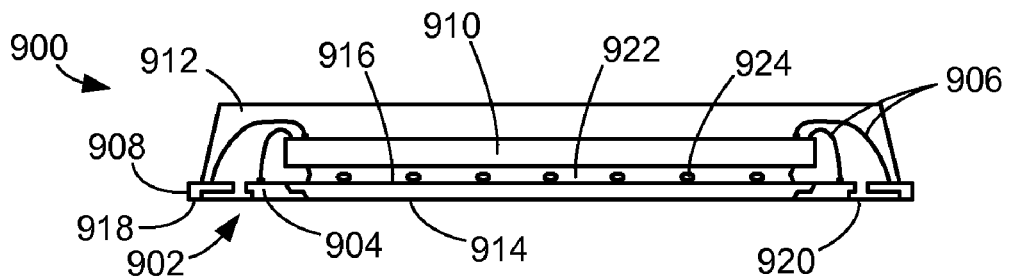
FIG. 9 is a cross-sectional view of an integrated circuit package system taken along lines 9-9 of FIG. 10 in a fifth embodiment of the present invention.
Figure 10:
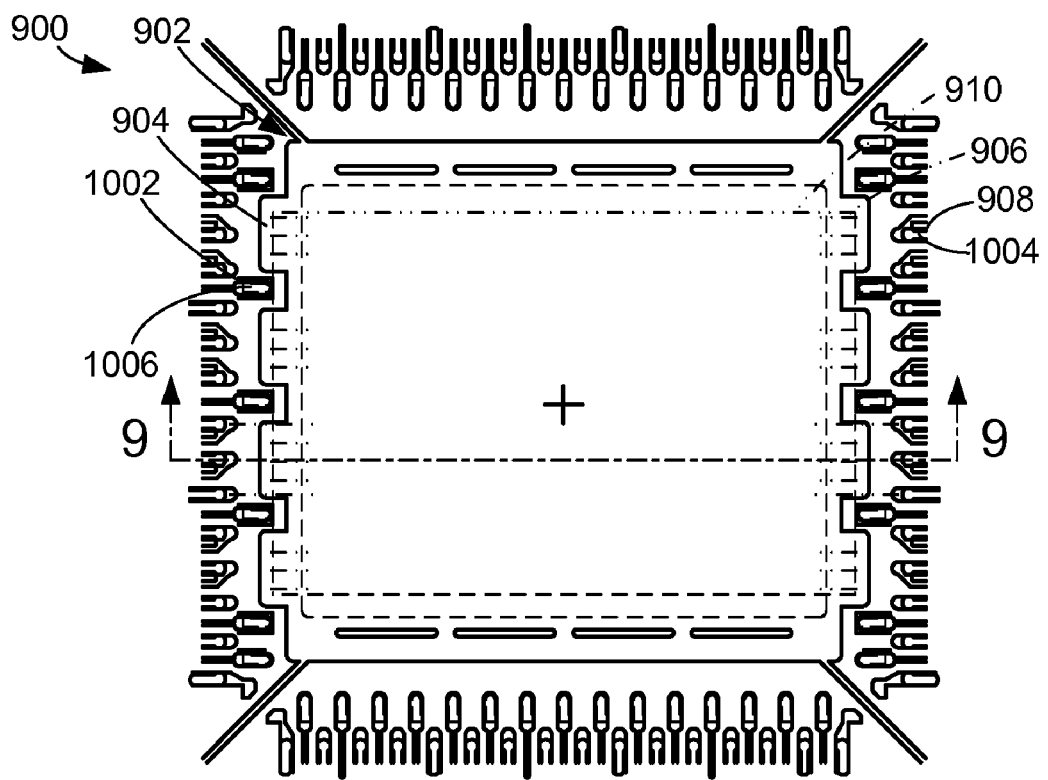
FIG. 10 is a top view of the integrated circuit package system.

Referring now to FIG. 9, therein is shown a cross-sectional view of an integrated circuit package system 900 taken along lines 9-9 of FIG. 10 in a fifth embodiment of the present invention. The integrated circuit package system 900 preferably includes a die paddle 902 having die pad extensions 904 on two sides of the die paddle 902.

The integrated circuit package system 900 can also include connectors 906 such as bond wires as well as outer leads 908. The outer leads 908 provide electrical connectivity for signals of an integrated circuit die 910. An encapsulant 912 can provide structural integrity and protection to the die paddle 902, the outer leads 908, the connectors 906, and the integrated circuit die 910.

The connectors 906 such as bond wires can connect the integrated circuit die 910 and the die pad extensions 904 on two sides of the die paddle 902. The connectors 906 connected to the die pad extensions 904 can preferably provide a ground level signal to the integrated circuit die 910. The connectors 906 can also electrically connect logic signals to the integrated circuit die 910 or the outer leads 908.

The die paddle 902 also includes a die pad lower surface 914 and a die pad upper surface 916. The die pad lower surface 914 can also be optionally exposed on a side opposite the integrated circuit die 910. An outer lead lower surface 918 can further be exposed on a side opposite the integrated circuit die 910 to provide electrical connectivity to a next level system such as another package or a printed circuit board (PCB).

The outer lead lower surface 918 can form a planar surface for interconnection. The planar surface can optionally be coplanar to an encapsulant bottom surface 920. The encapsulant bottom surface 920 can provide substantially exposed the outer lead lower surface 918 and optionally the die pad lower surface 914.

The integrated circuit die 910 can be mounted over the die pad upper surface 916 with a die attach layer 922 optionally having a spacer 924. The die pad upper surface 916 can provide a mounting surface for the integrated circuit die 910 on a side opposite the planar surface for interconnection. The die attach layer 922 and the spacer 924 can provide attachment and spacing of the integrated circuit die 910 and the mounting surface of the die pad upper surface 916.

For illustrative purposes, the integrated circuit package system 900 is shown as quad flat nolead package having characteristics of punch singulation although it is understood that any package type or singulation method may be used. Further, the integrated circuit package system 900 is shown having the die pad extensions 904 on two opposites sides of the die paddle 902 although it is understood that the die pad extensions 904 may be on any side or any number of sides of the die paddle 902.

Referring now to FIG. 10, therein is shown a top view of the integrated circuit package system 900. The integrated circuit package system 900 preferably includes the die paddle 902 having the die pad extensions 904 on two sides of the die paddle 902, inner leads 1002, and the outer leads 908. The integrated circuit die 910 can be mounted over the die paddle 902 that can also provide a connection surface for the ground level signal.

The integrated circuit die 910 can also be connected to the inner leads 1002 and the outer leads 908 for logic signals. The outer leads 908 can include an outer lead upper surface 1004 and similarly the inner leads 1002 can include an inner lead upper surface 1006. The inner lead upper surface 1006 and the outer lead upper surface 1004 can provide a connection surface for the connectors 906 and thereby the logical signals.

The die pad extensions 904 can be formed on a perimeter of the die paddle 902 to extend a portion of an outer edge of the die paddle. The die pad extensions 904 can optionally be formed in a shape of a rectangle having edges smaller than a planar dimension of the die paddle. Spacing is preferably provided between one of the die pad extensions 904 and another of the die pad extensions.

The die pad extensions 904 of the die paddle 902 can be formed on two sides of the die paddle 902 in regions having a portion of the inner leads 1002 depopulated on two sides of the die paddle 902. Depopulating the portion of the inner leads 1002 can preferably include one or more of the inner leads 1002 adjacent sides of the die pad extensions 904. The die pad extensions 904 are preferably formed having one or more of the inner leads 1002 between the die pad extensions 904 and adjacent locations of the die pad extensions 904.

Figure 11:
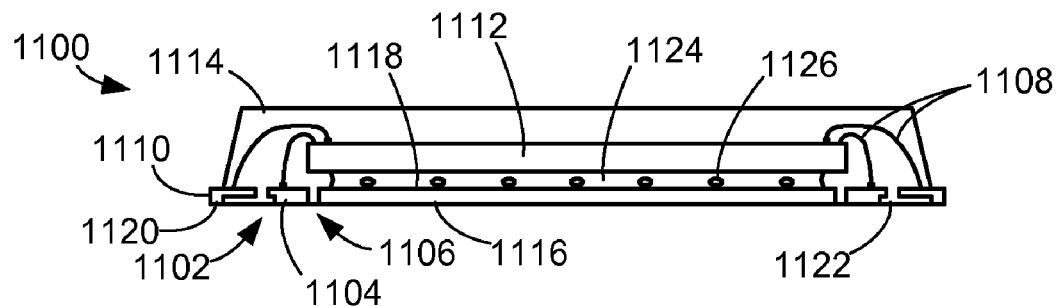
FIG. 11 is a cross-sectional view of an integrated circuit package system taken along lines 11-11 of FIG. 12 in a sixth embodiment of the present invention.
Figure 12:
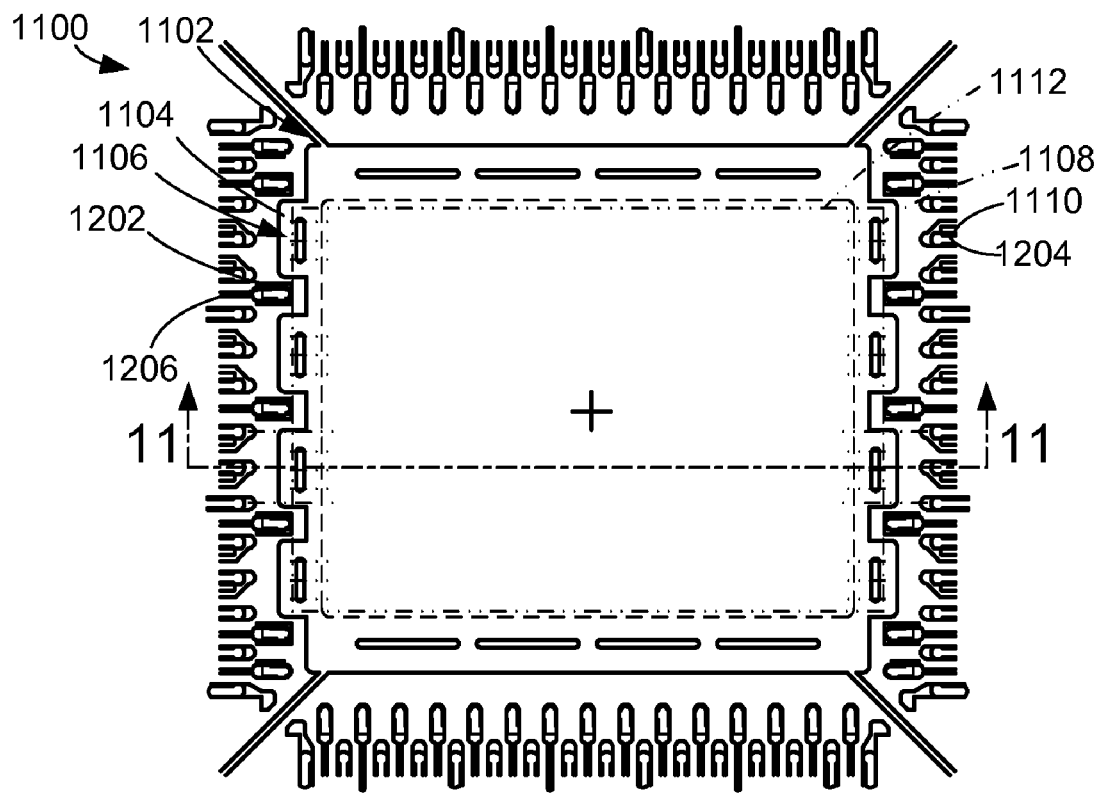
FIG. 12 is a top view of the integrated circuit package system.

Referring now to FIG. 11, therein is shown a cross-sectional view of an integrated circuit package system 1100 taken along lines 11-11 of FIG. 12 in a sixth embodiment of the present invention. The integrated circuit package system 1100 preferably includes a die paddle 1102 having die pad extensions 1104 on two sides of the die paddle 1102 and a die pad cavity 1106 such as a slot to enhance locking.

The integrated circuit package system 1100 can also include connectors 1108 such as bond wires and outer leads 1110. The outer leads 1110 provide electrical connectivity for signals of an integrated circuit die 1112. An encapsulant 1114 can provide structural integrity and protection to the die paddle 1102, the outer leads 1110, the connectors 1108, and the integrated circuit die 1112. The die pad cavity 1106 can improve the structural integrity and positioning of the encapsulant 1114.

The connectors 1108 such as bond wires can connect the integrated circuit die 1112 and the die pad extensions 1104 on two sides of the die paddle 1102. The connectors 1108 connected to the die pad extensions 1104 can preferably provide a ground level signal to the integrated circuit die 1112. The connectors 1108 can also electrically connect logic signals to the integrated circuit die 1112, or the outer leads 1110.

The die paddle 1102 also includes a die pad lower surface 1116 and a die pad upper surface 1118. The die pad cavity 1106 can preferably extend to the die pad lower surface 1116 and the die pad upper surface 1118. The die pad lower surface 1116 can also be optionally exposed on a side opposite the integrated circuit die 1112. An inner lead lower surface and an outer lead lower surface 1120 can further be exposed on a side opposite the integrated circuit die 1112 to provide electrical connectivity to a next level system such as another package or a printed circuit board (PCB).

The inner lead lower surface and the outer lead lower surface 1120 can form a planar surface for interconnection. The planar surface can optionally be coplanar to an encapsulant bottom surface 1122. The encapsulant bottom surface 1122 can provide substantially exposed the inner lead lower surface, the outer lead lower surface 1120, and optionally the die pad lower surface 1116.

The integrated circuit die 1112 can be mounted over the die pad upper surface 1118 with a die attach layer 1124 optionally having a spacer 1126. The die pad upper surface 1118 can provide a mounting surface for the integrated circuit die 1112 on a side opposite the planar surface for interconnection. The die attach layer 1124 and the spacer 1126 can provide attachment and spacing of the integrated circuit die 1112 and the mounting surface of the die pad upper surface 1118.

For illustrative purposes, the integrated circuit package system 1100 is shown as quad flat nolead package having characteristics of punch singulation although it is understood that any package type or singulation method may be used. Further, the integrated circuit package system 1100 is shown having the die pad extensions 1104 on two opposites sides of the die paddle 1102 although it is understood that the die pad extensions 1104 may be on any side or any number of sides of the die paddle 1102.

Referring now to FIG. 12, therein is shown a top view of the integrated circuit package system 1100. The integrated circuit package system 1100 preferably includes the die paddle 1102 having the die pad extensions 1104 on two sides of the die paddle 1102, the die pad cavity 1106, inner leads 1202, and the outer leads 1110. The integrated circuit die 1112 can be mounted over the die paddle 1102 that can also provide a connection surface for the ground level signal.

The integrated circuit die 1112 can also be connected to the inner leads 1202 and the outer leads 1110 for logic signals. The outer leads 1110 can include an outer lead upper surface 1204 and similarly the inner leads 1202 can include an inner lead upper surface 1206. The inner lead upper surface 1206 and the outer lead upper surface 1204 can provide a connection surface for the connectors 1108 and thereby the logical signals.

The encapsulant 1114 can provide structural integrity and protection to the die paddle 1102, the inner leads, the outer leads 1110, the connectors 1108, and the integrated circuit die 1112. The die pad cavity 1106 can improve the structural integrity and positioning of the encapsulant 1114.

The die pad extensions 1104 can be formed on a perimeter of the die paddle 1102 to extend a portion of an outer edge of the die paddle. The die pad extensions 1104 can optionally be formed in a shape of a rectangle having edges smaller than a planar dimension of the die paddle. Spacing is preferably provided between one of the die pad extensions 1104 and another of the die pad extensions.

The die pad extensions 1104 of the die paddle 1102 can be formed on two sides of the die paddle 1102 in regions having a portion of the inner leads 1202 depopulated. Depopulating the portion of the inner leads 1202 can preferably include one or more of the inner leads 1202 adjacent sides of the die pad extensions 1104. The die pad extensions 1104 are preferably formed having one or more of the inner leads 1202 between the die pad extensions 1104 and adjacent locations of the die pad extensions 1104.

Figure 13:
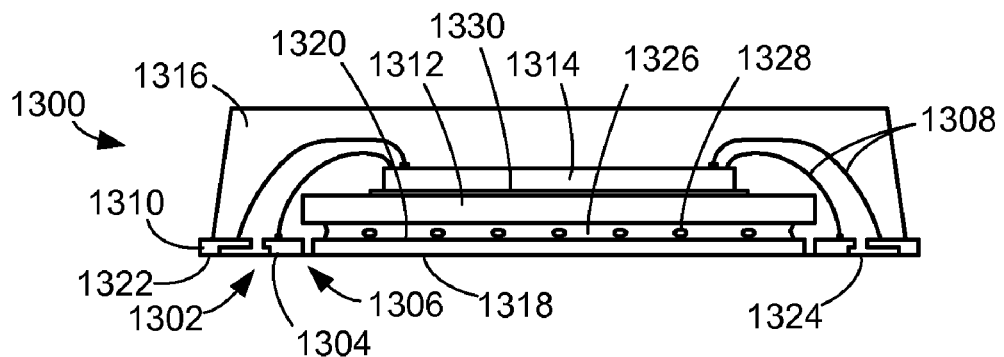
FIG. 13 is a cross-sectional view of an integrated circuit package system in a seventh embodiment of the present invention.

Referring now to FIG. 13, therein is shown a cross-sectional view of an integrated circuit package system 1300 in a seventh embodiment of the present invention. The integrated circuit package system 1300 preferably includes a die paddle 1302 having die pad extensions 1304 and a die pad cavity 1306 such as a slot to enhance locking.

The integrated circuit package system 1300 can also include connectors 1308 such as bond wires and outer leads 1310. The outer leads 1310 provide electrical connectivity for signals of a first integrated circuit die 1312 or a second integrated circuit die 1314. An encapsulant 1316 can provide structural integrity and protection to the die paddle 1302, the outer leads 1310, the connectors 1308, and the first integrated circuit die 1312. The die pad cavity 1306 can improve the structural integrity and positioning of the encapsulant 1316.

The connectors 1308 such as bond wires can connect the first integrated circuit die 1312 and the die pad extensions 1304 of the die paddle 1302. The connectors 1308 connected to the die pad extensions 1304 can preferably provide a ground level signal to the first integrated circuit die 1312. The connectors 1308 can also electrically connect logic signals to the first integrated circuit die 1312, or the outer leads 1310.

The die paddle 1302 also includes a die pad lower surface 1318 and a die pad upper surface 1320. The die pad cavity 1306 can preferably extend to the die pad lower surface 1318 and the die pad upper surface 1320. The die pad lower surface 1318 can also be optionally exposed on a side opposite the first integrated circuit die 1312. An outer lead lower surface 1322 can further be exposed on a side opposite the first integrated circuit die 1312 to provide electrical connectivity to a next level system such as another package or a printed circuit board (PCB).

The outer lead lower surface 1322 can form a planar surface for interconnection. The planar surface can optionally be coplanar to an encapsulant bottom surface 1324. The encapsulant bottom surface 1324 can provide substantially exposed the outer lead lower surface 1322, and optionally the die pad lower surface 1318.

The first integrated circuit die 1312 can be mounted over the die pad upper surface 1320 with a first die attach layer 1326 optionally having a spacer 1328. The second integrated circuit die 1314 can be mounted over the first integrated circuit die 1312 with a second die attach layer 1330. The die pad upper surface 1320 can provide a mounting surface for the first integrated circuit die 1312 on a side opposite the planar surface for interconnection. The first die attach layer 1326 and the spacer 1328 can provide attachment and spacing of the first integrated circuit die 1312 and the mounting surface of the die pad upper surface 1320.

For illustrative purposes, the integrated circuit package system 1300 is shown as quad flat nolead package having characteristics of punch singulation although it is understood that any package type or singulation method may be used. Further, the integrated circuit package system 1300 is shown having two integrated circuit die although it is understood that any number of integrated circuit die may be used.

Figure 14:
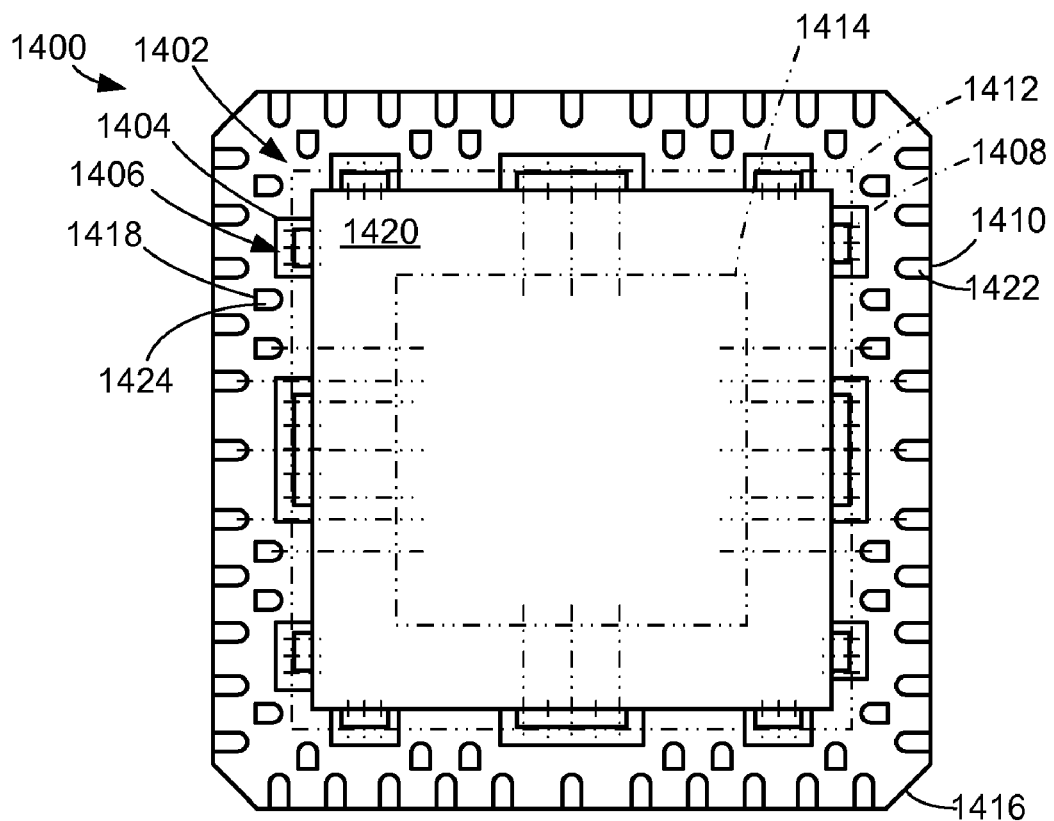
FIG. 14 is a top view of an integrated circuit package system with encapsulation partially removed in an eighth embodiment of the present invention.

Referring now to FIG. 14, therein is shown a top view of an integrated circuit package system 1400 with encapsulation partially removed in an eighth embodiment of the present invention. The integrated circuit package system 1400 is similar to the integrated circuit package system 1300 except for having the characteristic of saw singulation.

The integrated circuit package system 1400 preferably includes a die paddle 1402 having die pad extensions 1404 and a die pad cavity 1406 to enhance locking. Connectors 1408 can provide connectivity to a first integrated circuit die 1412 and a second integrated circuit die 1414 for a ground level signal or logic signals.

A portion of an encapsulant 1416 has been removed for clarity. The encapsulant 1416 can provide structural integrity and protection to the integrated circuit package system 1400. The die pad cavity 1406 can improve the structural integrity and positioning of the encapsulant 1416.

The first integrated circuit die 1412 and the second integrated circuit die 1414 can also be connected to the die pad extensions 1404 for a ground level signal or to inner leads 1418 and outer leads 1410 for logic signals. The die paddle 1402 includes a die pad upper surface 1420 to provide a connection surface for the connectors 1408. Similarly, the outer leads 1410 also include an outer lead upper surface 1422 and the inner leads 1418 include an inner lead upper surface 1424 to provide a connection surface for the connectors 1408.

The die pad extensions 1404 can be formed on a perimeter of the die paddle 1402 to extend a portion of an outer edge of the die paddle. The die pad extensions 1404 can optionally be formed in a shape of a rectangle having edges smaller than a planar dimension of the die paddle. Spacing is preferably provided between one of the die pad extensions 1404 and another of the die pad extensions.

The die pad extensions 1404 of the die paddle 1402 can be formed in regions having a portion of the inner leads 1418 depopulated. Depopulating the portion of the inner leads 1418 can preferably include one or more of the inner leads 1418 adjacent sides of the die pad extensions 1404. The die pad extensions 1404 are preferably formed having one or more of the inner leads 1418 between the die pad extensions 1404 and adjacent locations of the die pad extensions 1404.

Figure 15:
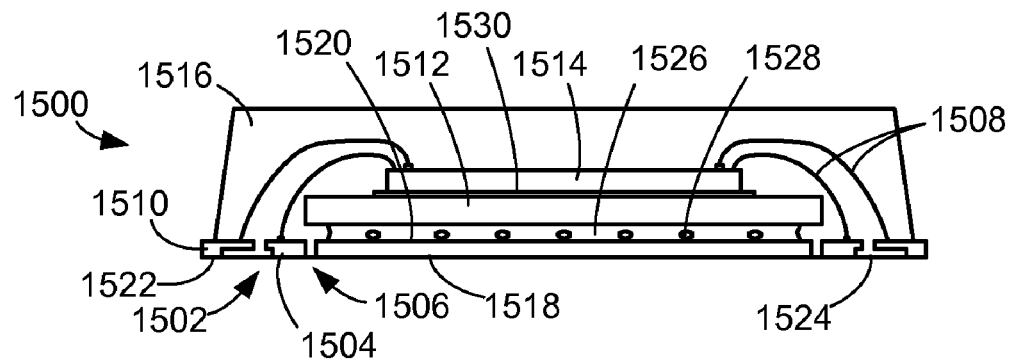
FIG. 15 is a top view of an integrated circuit package system in a ninth embodiment of the present invention.

Referring now to FIG. 15, therein is shown a top view of an integrated circuit package system 1500 in a ninth embodiment of the present invention. The integrated circuit package system 1500 includes a die paddle 1502 having die pad extensions 1504 on two sides of the die paddle 1502 and a die pad cavity 1506 such as a slot to enhance locking.

The integrated circuit package system 1500 can also include connectors 1508 such as bond wires and outer leads 1510. The outer leads 1510 provide electrical connectivity for signals of a first integrated circuit die 1512 or a second integrated circuit die 1514. An encapsulant 1516 can provide structural integrity and protection to the die paddle 1502, the outer leads 1510, the connectors 1508, and the first integrated circuit die 1512. The die pad cavity 1506 can improve the structural integrity and positioning of the encapsulant 1516.

The connectors 1508 such as bond wires can connect the first integrated circuit die 1512 and the die pad extensions 1504 on two sides of the die paddle 1502. The connectors 1508 connected to the die pad extensions 1504 can preferably provide a ground level signal to the first integrated circuit die 1512. The connectors 1508 can also electrically connect logic signals to the first integrated circuit die 1512, or the outer leads 1510.

The die paddle 1502 also includes a die pad lower surface 1518 and a die pad upper surface 1520. The die pad cavity 1506 can preferably extend to the die pad lower surface 1518 and the die pad upper surface 1520. The die pad lower surface 1518 can also be optionally exposed on a side opposite the first integrated circuit die 1512. An outer lead lower surface 1522 can further be exposed on a side opposite the first integrated circuit die 1512 to provide electrical connectivity to a next level system such as another package or a printed circuit board (PCB).

The outer lead lower surface 1522 can form a planar surface for interconnection. The planar surface can optionally be coplanar to an encapsulant bottom surface 1524. The encapsulant bottom surface 1524 can provide substantially exposed the outer lead lower surface 1522, and optionally the die pad lower surface 1518.

The first integrated circuit die 1512 can be mounted over the die pad upper surface 1520 with a first die attach layer 1526 optionally having a spacer 1528. The second integrated circuit die 1514 can be mounted over the first integrated circuit die 1512 with a second die attach layer 1530. The die pad upper surface 1520 can provide a mounting surface for the first integrated circuit die 1512 on a side opposite the planar surface for interconnection. The first die attach layer 1526 and the spacer 1528 can provide attachment and spacing of the first integrated circuit die 1512 and the mounting surface of the die pad upper surface 1520.

For illustrative purposes, the integrated circuit package system 1500 is shown as quad flat nolead package having characteristics of punch singulation although it is understood that any package type or singulation method may be used. Further, the integrated circuit package system 1500 is shown having the die pad extensions 1504 on two opposites sides of the die paddle 1502 although it is understood that the die pad extensions 1504 may be on any side or any number of sides of the die paddle 1502.

Figure 16:
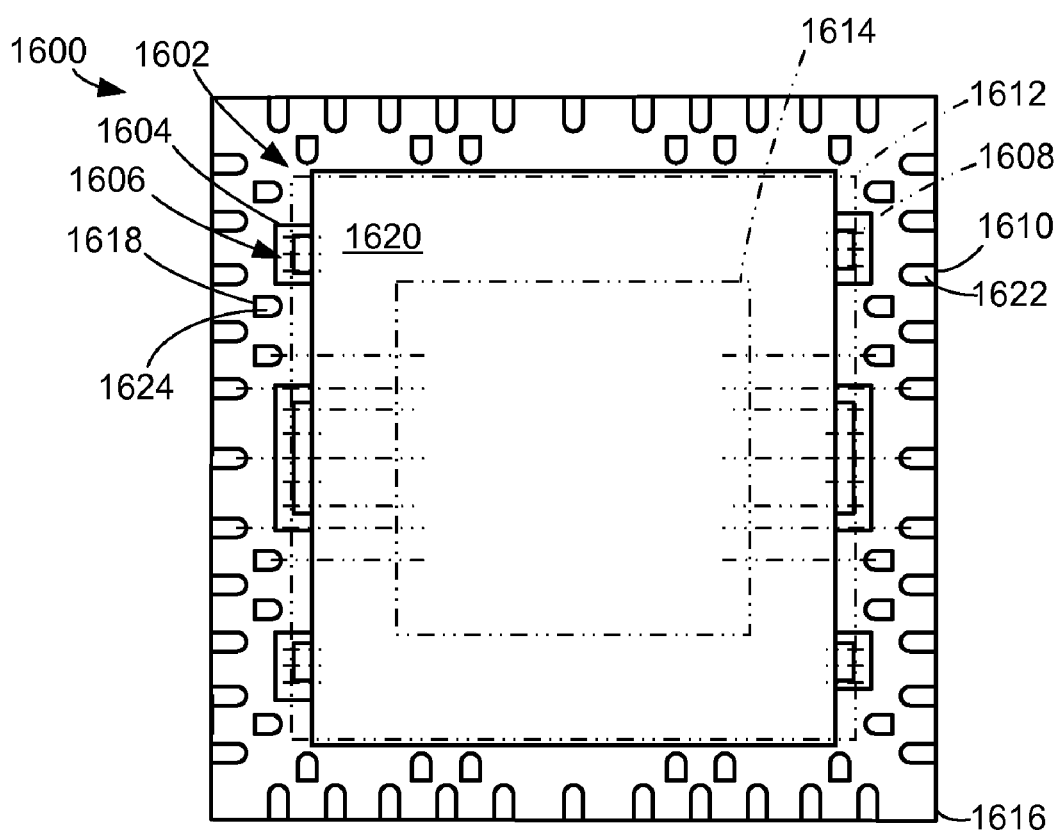
FIG. 16 is a cross-sectional view of an integrated circuit package system with encapsulation partially removed in a tenth embodiment of the present invention.

Referring now to FIG. 16, therein is shown a cross-sectional view of an integrated circuit package system 1600 with encapsulation partially removed in a tenth embodiment of the present invention. The integrated circuit package system 1600 is similar to the integrated circuit package system 1500 except for having the characteristics of saw singulation.

The integrated circuit package system 1600 preferably includes a die paddle 1602 having die pad extensions 1604 on two sides of the die paddle 1602 and a die pad cavity 1606 to enhance locking. Connectors 1608 can provide connectivity such as outer leads 1610 to a first integrated circuit die 1612 and a second integrated circuit die 1614 for a ground level signal or logic signals.

A portion of an encapsulant 1616 has been removed for clarity. The encapsulant 1616 can provide structural integrity and protection to the integrated circuit package system 1600. The die pad cavity 1606 can improve the structural integrity and positioning of the encapsulant 1616.

The first integrated circuit die 1612 and the second integrated circuit die 1614 can also be connected to the die pad extensions 1604 for a ground level signal or to inner leads 1618 and the outer leads 1610 for logic signals. The die paddle 1602 includes a die pad upper surface 1620 to provide a connection surface for the connectors 1608. Similarly, the outer leads 1610 also include an outer lead upper surface 1622 and the inner leads 1618 include an inner lead upper surface 1624 to provide a connection surface for the connectors 1608.

The die pad extensions 1604 can be formed on a perimeter of the die paddle 1602 to extend a portion of an outer edge of the die paddle. The die pad extensions 1604 can optionally be formed in a shape of a rectangle having edges smaller than a planar dimension of the die paddle. Spacing is preferably provided between one of the die pad extensions 1604 and another of the die pad extensions.

The die pad extensions 1604 of the die paddle 1602 can be formed in regions on two sides of the die paddle 1602 having a portion of the inner leads 1618 depopulated. Depopulating the portion of the inner leads 1618 can preferably include one or more of the inner leads 1618 adjacent sides of the die pad extensions 1604. The die pad extensions 1604 are preferably formed having one or more of the inner leads 1618 between the die pad extensions 1604 and adjacent locations of the die pad extensions 1604.

Figure 17:
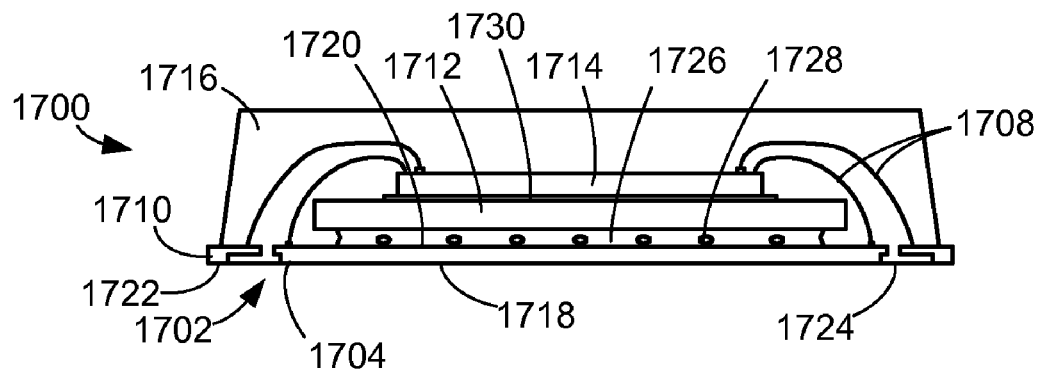
FIG. 17 is a cross-sectional view of an integrated circuit package system in an eleventh embodiment of the present invention.

Referring now to FIG. 17, therein is shown a cross-sectional view of an integrated circuit package system 1700 in an eleventh embodiment of the present invention. The integrated circuit package system 1700 preferably includes a die paddle 1702 having die pad extensions 1704.

The integrated circuit package system 1700 can also include connectors 1708 such as bond wires and outer leads 1710. The outer leads 1710 provide electrical connectivity for signals of a first integrated circuit die 1712 or a second integrated circuit die 1714. An encapsulant 1716 can provide structural integrity and protection to the die paddle 1702, the outer leads 1710, the connectors 1708, and the first integrated circuit die 1712.

The connectors 1708 such as bond wires can connect the first integrated circuit die 1712 and the die pad extensions 1704 of the die paddle 1702. The connectors 1708 connected to the die pad extensions 1704 can preferably provide a ground level signal to the first integrated circuit die 1712. The connectors 1708 can also electrically connect logic signals to the first integrated circuit die 1712, or the outer leads 1710.

The die paddle 1702 also includes a die pad lower surface 1718 and a die pad upper surface 1720. The die pad lower surface 1718 can also be optionally exposed on a side opposite the first integrated circuit die 1712. An outer lead lower surface 1722 can further be exposed on a side opposite the first integrated circuit die 1712 to provide electrical connectivity to a next level system such as another package or a printed circuit board (PCB).

The outer lead lower surface 1722 can form a planar surface for interconnection. The planar surface can optionally be coplanar to an encapsulant bottom surface 1724. The encapsulant bottom surface 1724 can provide substantially exposed the outer lead lower surface 1722, and optionally the die pad lower surface 1718.

The first integrated circuit die 1712 can be mounted over the die pad upper surface 1720 with a first die attach layer 1726 optionally having a spacer 1728. The second integrated circuit die 1714 can be mounted over the first integrated circuit die 1712 with a second die attach layer 1730. The die pad upper surface 1720 can provide a mounting surface for the first integrated circuit die 1712 on a side opposite the planar surface for interconnection. The first die attach layer 1726 and the spacer 1728 can provide attachment and spacing of the first integrated circuit die 1712 and the mounting surface of the die pad upper surface 1720.

For illustrative purposes, the integrated circuit package system 1700 is shown as quad flat nolead package having characteristics of punch singulation although it is understood that any package type or singulation method may be used. Further, the integrated circuit package system 1700 is shown having two integrated circuit die although it is understood that any number of integrated circuit die may be used.

Figure 18:
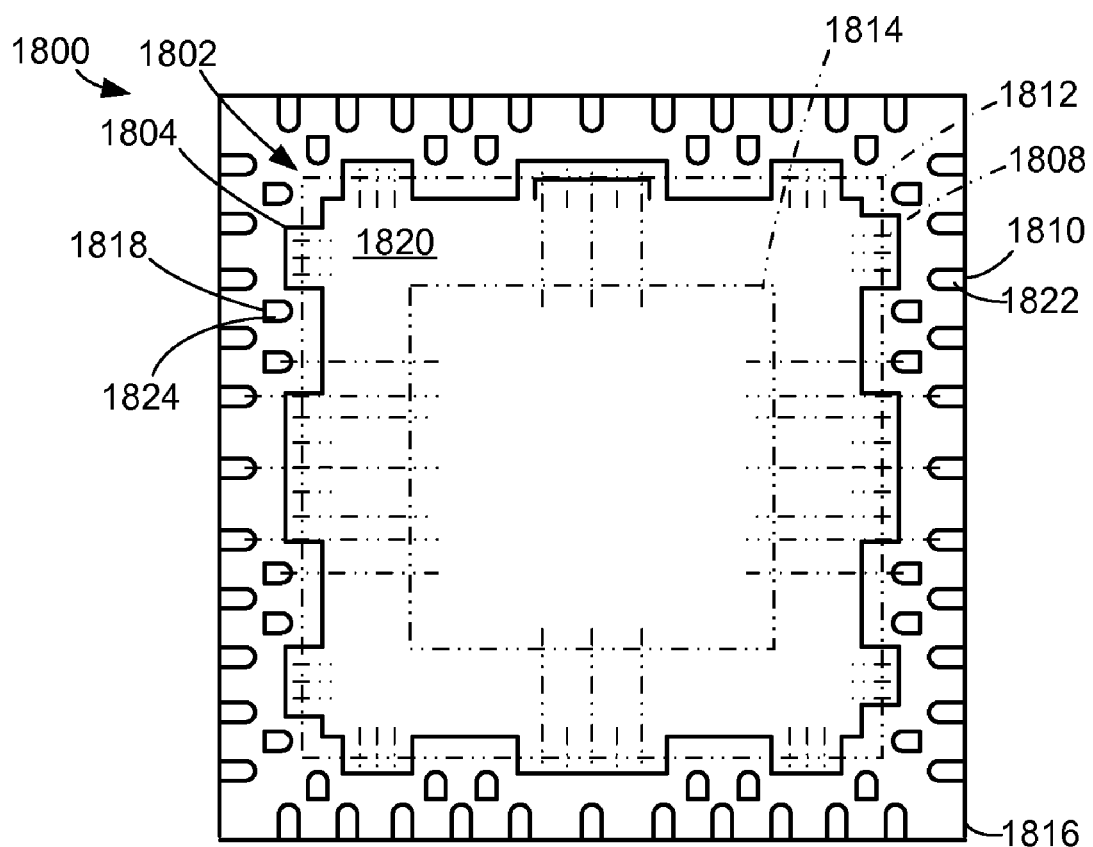
FIG. 18 is a cross-sectional view of an integrated circuit package system with encapsulation partially removed in a twelfth embodiment of the present invention.

Referring now to FIG. 18, therein is shown a cross-sectional view of an integrated circuit package system 1800 with encapsulation partially removed in a twelfth embodiment of the present invention. The integrated circuit package system 1800 is similar to the integrated circuit package system 1700 except for having the characteristics of saw singulation.

The integrated circuit package system 1800 preferably includes a die paddle 1802 having die pad extensions 1804. Connectors 1808 can provide connectivity such as to outer leads 1810 and a first integrated circuit die 1812 and a second integrated circuit die 1814 for a ground level signal or logic signals. A portion of an encapsulant 1816 has been removed for clarity. The encapsulant 1816 can provide structural integrity and protection to the integrated circuit package system 1800.

The first integrated circuit die 1812 and the second integrated circuit die 1814 can also be connected to the die pad extensions 1804 for a ground level signal or to inner leads 1818 and the outer leads 1810 for logic signals. The die paddle 1802 includes a die pad upper surface 1820 to provide a connection surface for the connectors 1808. Similarly, the outer leads 1810 also include an outer lead upper surface 1822 and the inner leads 1818 include an inner lead upper surface 1824 to provide a connection surface for the connectors 1808.

The die pad extensions 1804 can be formed on a perimeter of the die paddle 1802 to extend a portion of an outer edge of the die paddle. The die pad extensions 1804 can optionally be formed in a shape of a rectangle having edges smaller than a planar dimension of the die paddle. Spacing is preferably provided between one of the die pad extensions 1804 and another of the die pad extensions.

The die pad extensions 1804 of the die paddle 1802 can be formed in regions having a portion of the inner leads 1818 depopulated. Depopulating the portion of the inner leads 1818 can preferably include one or more of the inner leads 1818 adjacent sides of the die pad extensions 1804. The die pad extensions 1804 are preferably formed having one or more of the inner leads 1818 between the die pad extensions 1804 and adjacent locations of the die pad extensions 1804.

Figure 19:
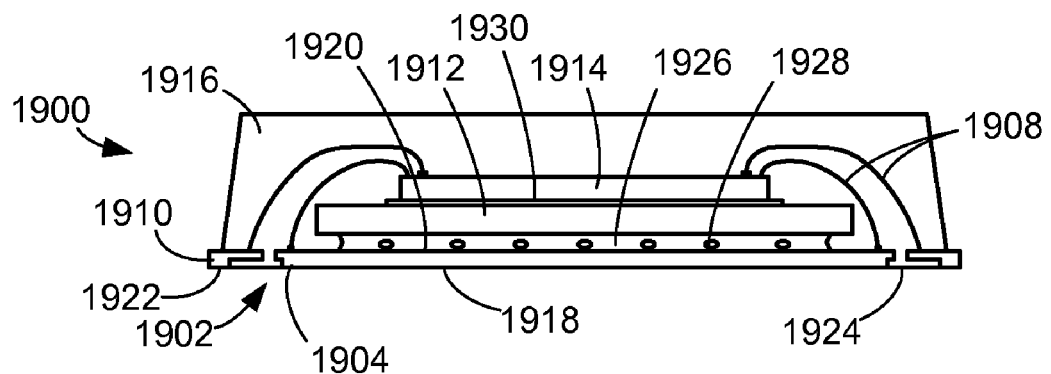
FIG. 19 is a cross-sectional view of an integrated circuit package system in a thirteenth embodiment of the present invention.

Referring now to FIG. 19, therein is shown a cross-sectional view of an integrated circuit package system 1900 in a thirteenth embodiment of the present invention. The integrated circuit package system 1900 preferably includes a die paddle 1902 having die pad extensions 1904 on two sides of the die paddle 1902.

The integrated circuit package system 1900 can also include connectors 1908 such as bond wires and outer leads 1910. The outer leads 1910 provide electrical connectivity for signals of a first integrated circuit die 1912 or a second integrated circuit die 1914. An encapsulant 1916 can provide structural integrity and protection to the die paddle 1902, the outer leads 1910, the connectors 1908, and the first integrated circuit die 1912.

The connectors 1908 such as bond wires can connect the first integrated circuit die 1912 and the die pad extensions 1904 on two sides of the die paddle 1902. The connectors 1908 connected to the die pad extensions 1904 can preferably provide a ground level signal to the first integrated circuit die 1912. The connectors 1908 can also electrically connect logic signals to the first integrated circuit die 1912, or the outer leads 1910.

The die paddle 1902 also includes a die pad lower surface 1918 and a die pad upper surface 1920. The die pad lower surface 1918 can also be optionally exposed on a side opposite the first integrated circuit die 1912. An outer lead lower surface 1922 can further be exposed on a side opposite the first integrated circuit die 1912 to provide electrical connectivity to a next level system such as another package or a printed circuit board (PCB).

The outer lead lower surface 1922 can form a planar surface for interconnection. The planar surface can optionally be coplanar to an encapsulant bottom surface 1924. The encapsulant bottom surface 1924 can provide substantially exposed the outer lead lower surface 1922, and optionally the die pad lower surface 1918.

The first integrated circuit die 1912 can be mounted over the die pad upper surface 1920 with a first die attach layer 1926 optionally having a spacer 1928. The second integrated circuit die 1914 can be mounted over the first integrated circuit die 1912 with a second die attach layer 1930. The die pad upper surface 1920 can provide a mounting surface for the first integrated circuit die 1912 on a side opposite the planar surface for interconnection. The first die attach layer 1926 and the spacer 1928 can provide attachment and spacing of the first integrated circuit die 1912 and the mounting surface of the die pad upper surface 1920.

For illustrative purposes, the integrated circuit package system 1900 is shown as quad flat nolead package having characteristics of punch singulation although it is understood that any package type or singulation method may be used. Further, the integrated circuit package system 1900 is shown having two integrated circuit die although it is understood that any number of integrated circuit die may be used.

Figure 20:
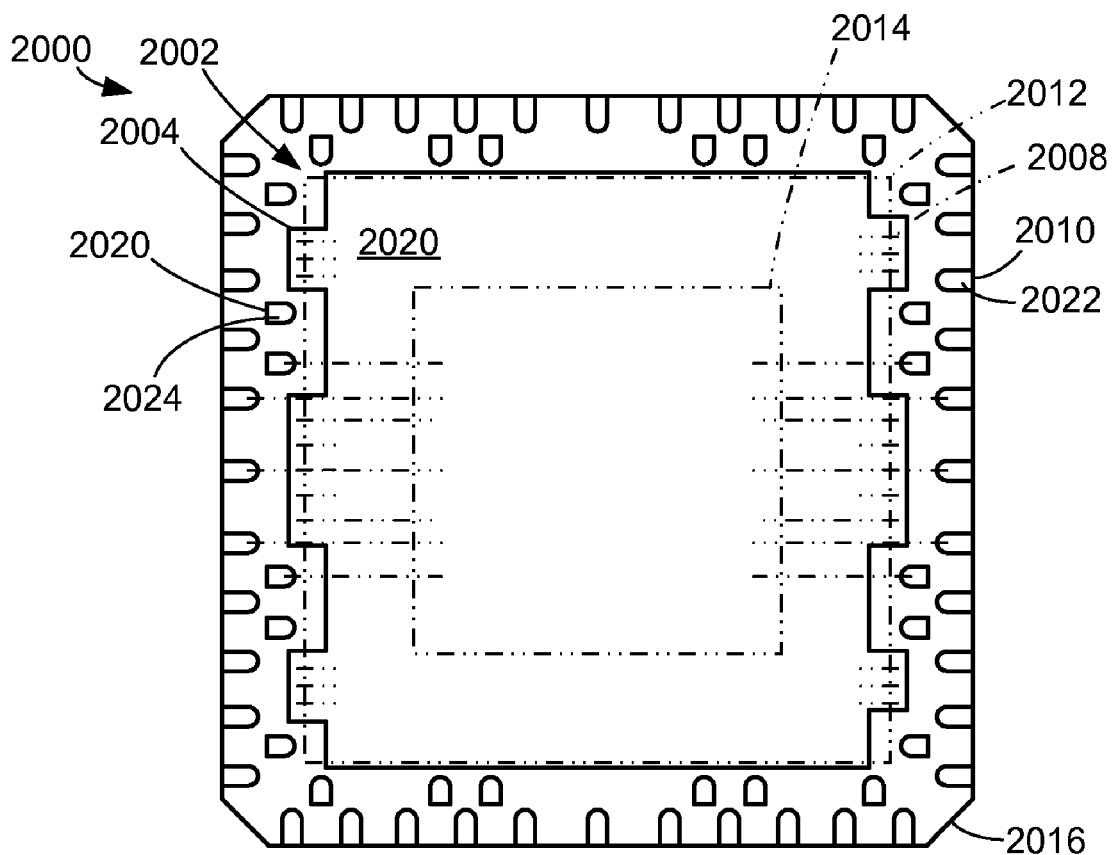
FIG. 20 is a cross-sectional view of an integrated circuit package system with encapsulation partially removed in a fourteenth embodiment of the present invention.

Referring now to FIG. 20, therein is shown a cross-sectional view of an integrated circuit package system 2000 with encapsulation partially removed in a fourteenth embodiment of the present invention. The integrated circuit package system 2000 is similar to the integrated circuit package system 1900 except for having the characteristics of saw singulation.

The integrated circuit package system 2000 preferably includes a die paddle 2002 having die pad extensions 2004 on two sides of the die paddle 2002. Connectors 2008 can provide connectivity such as outer leads 2010 to a first integrated circuit die 2012 and a second integrated circuit die 2014 for a ground level signal or logic signals. A portion of an encapsulant 2016 has been removed for clarity. The encapsulant 2016 can provide structural integrity and protection to the integrated circuit package system 2000.

The first integrated circuit die 2012 and the second integrated circuit die 2014 can also be connected to the die pad extensions 2004 on two sides of the die paddle 2002 for a ground level signal or to inner leads 2018 and the outer leads 2010 for logic signals. The die paddle 2002 includes a die pad upper surface 2020 to provide a connection surface for the connectors 2008. Similarly, the outer leads 2010 also include an outer lead upper surface 2022 and the inner leads 2018 include an inner lead upper surface 2024 to provide a connection surface for the connectors 2008.

The die pad extensions 2004 can be formed on a perimeter of the die paddle 2002 to extend a portion of an outer edge of the die paddle. The die pad extensions 2004 can optionally be formed in a shape of a rectangle having edges smaller than a planar dimension of the die paddle. Spacing is preferably provided between one of the die pad extensions 2004 and another of the die pad extensions.

The die pad extensions 2004 of the die paddle 2002 can be formed in regions on two sides of the die paddle 2002 having a portion of the inner leads 2018 depopulated. Depopulating the portion of the inner leads 2018 can preferably include one or more of the inner leads 2018 adjacent sides of the die pad extensions 2004. The die pad extensions 2004 are preferably formed having one or more of the inner leads 2018 between the die pad extensions 2004 and adjacent locations of the die pad extensions 2004.

Figure 21:
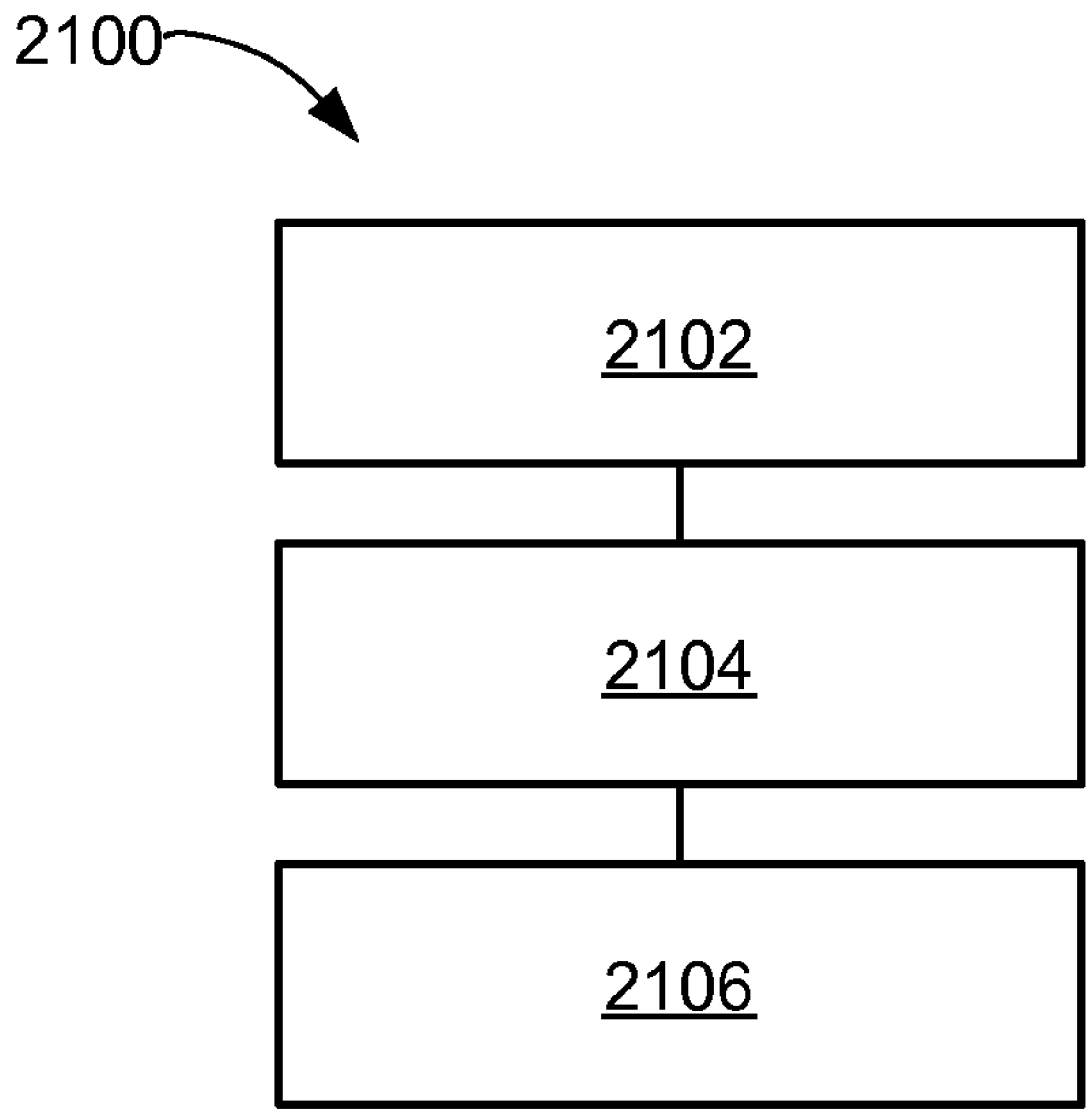
FIG. 21 is a flow chart of an integrated circuit package system for manufacturing the integrated circuit package system in an embodiment of the present invention.

Referring now to FIG. 21, therein is shown a flow chart of an integrated circuit package system 2100 for manufacturing the integrated circuit package system 100 in an embodiment of the present invention. The system 2100 includes forming leads adjacent a die paddle having a die pad extension in a block 2102; forming a region having one of the leads depopulated for the die pad extension in a block 2104; and connecting an integrated circuit die to the die pad extension in a block 2106.

In greater detail, a system to provide the method and apparatus of the integrated circuit package system 100, in an embodiment of the present invention, is performed as follows:

1. Forming inner leads and outer leads adjacent a die paddle having a die pad extension.
2. Depopulating a region of the inner leads for the die pad extension.
3. Mounting an integrated circuit die over the die paddle having the die pad extension.
4. Attaching a connector to the integrated circuit die and the die pad extension.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   forming leads adjacent a die paddle having a die pad extension;
   forming a region of a row of the leads facing the die paddle, the region having one of the leads depopulated between another two of the leads in the row for the die pad extension; and
   connecting an integrated circuit die to the die pad extension.

2. The method as claimed in claim 1 wherein forming the leads includes forming inner leads and outer leads.

3. The method as claimed in claim 1 wherein forming the die pad extension includes forming the die pad extension on two sides of the die paddle.

4. The method as claimed in claim 1 wherein forming the die pad extension includes forming a die pad cavity for a locking feature.

5. The method as claimed in claim 1 further comprising connecting a second integrated circuit die over the integrated circuit die.

6. A method for manufacturing an integrated circuit package system comprising:
   forming inner leads and outer leads adjacent a die paddle having a die pad extension;
   depopulating a region of a row of the inner leads facing the die paddle for the die pad extension, two of the inner leads of the row on opposite sides of the region and the die pad extension;
   mounting an integrated circuit die over the die paddle having the die pad extension; and attaching a connector to the integrated circuit die and the die pad extension.

7. The method as claimed in claim 6 wherein forming the inner leads and the outer leads includes forming the outer leads adjacent a perimeter of the inner leads.

8. The method as claimed in claim 6 wherein forming the die pad extension includes forming the die pad extension on opposite sides of the die paddle.

9. The method as claimed in claim 6 wherein forming the die pad extension includes forming a die pad cavity extended to a die pad upper surface and a die pad lower surface.

10. The method as claimed in claim 6 further comprising mounting a second integrated circuit die over the integrated circuit die wherein the second integrated circuit die is connected to the die paddle, the inner leads, or the outer leads.

11. An integrated circuit package system comprising:
   leads adjacent a die paddle having a die pad extension;
   a region of a row of the leads facing the die paddle, the region having one of the leads depopulated between another two of the leads in the row for the die pad extension; and
   an integrated circuit die connected to the die pad extension.

12. The system as claimed in claim 11 wherein the leads include inner leads and outer leads.

13. The system as claimed in claim 11 wherein the die pad extension includes the die pad extension on two sides of the die paddle.

14. The system as claimed in claim 11 wherein the die pad extension includes a die pad cavity for a locking feature.

15. The system as claimed in claim 11 further comprising a second integrated circuit die over the integrated circuit die.

16. The system as claimed in claim 11 wherein:
   inner leads and outer leads adjacent a die paddle having a die pad extension;
   a region of the inner leads depopulated for the die pad extension;
   an integrated circuit die over the die paddle having the die pad extension; and
   a connector to the integrated circuit die and the die pad extension.

17. The system as claimed in claim 16 wherein the inner leads and the outer leads includes the outer leads adjacent a perimeter of the inner leads.

18. The system as claimed in claim 16 wherein the die pad extension includes the die pad extension on opposite sides of the die paddle.

19. The system as claimed in claim 16 wherein the die pad extension includes a die pad cavity extended to a die pad upper surface and a die pad lower surface.

20. The system as claimed in claim 16 further comprising a second integrated circuit die over the integrated circuit die wherein the second integrated circuit die is connected to the die paddle, the inner leads, or the outer leads.

* * * * *

UNITED STATES PATENT AND TRADEMARK OFFICE
CERTIFICATE OF CORRECTION

PATENT NO. : 8,062,934 B2
APPLICATION NO. : 11/766785
DATED : November 22, 2011
INVENTOR(S) : Punzalan et al.

It is certified that error appears in the above-identified patent and that said Letters Patent is hereby corrected as shown below:

Column 2:
line 60, add double dashes between numbers 3-3 as follows: delete "lines 3-3 of FIG. 4" and insert therefor --lines 3--3 of FIG. 4--

Column 3:
line 2, add double dashes between numbers 7-7 as follows: delete "lines 7-7 of FIG. 8" and insert therefor --lines 7--7 of FIG. 8-- line 7, add double dashes between numbers 9-9 as follows: delete "lines 9-9 of FIG. 10" and insert therefor --lines 9--9 of FIG. 10-- line 12, add double dashes between numbers 11-11 as follows: delete "lines 11-11 of FIG. 12" and insert therefor --lines 11--11 of FIG. 12--

Column 5:
line 38, add double dashes between numbers 3-3 as follows: delete "lines 3-3 of FIG. 4" and insert therefor --lines 3--3 of FIG. 4--

Column 8:
line 8, add double dashes between numbers 8-8 as follows: delete "lines 8-8 of FIG. 8" and insert therefor --lines 8--8 of FIG. 8--

Column 9:
line 39, add double dashes between numbers 9-9 as follows: delete "lines 9-9 of FIG. 10" and insert therefor --lines 9--9 of FIG. 10--

Column 10:
line 54, add double dashes between numbers 11-11 as follows: delete "lines 11-11 of FIG. 12" and insert therefor --lines 11--11 of FIG. 12--

Signed and Sealed this
Tenth Day of April, 2012

David J. Kappos
*Director of the United States Patent and Trademark Office*